(12) United States Patent
Nomura et al.

(10) Patent No.: US 9,697,954 B2
(45) Date of Patent: Jul. 4, 2017

(54) METHOD FOR FORMING PATTERN (71) Applicant: NATIONAL INSTITUTE OF ADVANCED INDUSTRIAL SCIENCE AND TECHNOLOGY, Tokyo (JP)

(72) Inventors: Kenichi Nomura, Tsukuba (JP); Hirobumi Ushijima, Tsukuba (JP); Noriko Iwase, Tsukuba (JP); Manabu Yoshida, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/430,700

(22) PCT Filed: Sep. 11, 2013

(86) PCT No.: PCT/JP2013/074551
§ 371 (c)(1),
(2) Date: Mar. 24, 2015

(87) PCT Pub. No.: WO2014/050560
PCT Pub. Date: Apr. 3, 2014

(65) Prior Publication Data
US 2015/0243441 A1    Aug. 27, 2015

(30) Foreign Application Priority Data

Sep. 25, 2012    (JP) .................................. 2012-210892

(51) Int. Cl.
*B05D 5/12*    (2006.01)
*H01G 4/30*    (2006.01)
(Continued)

(52) U.S. Cl.
CPC ........... *H01G 4/308* (2013.01); *C09D 11/037* (2013.01); *C09D 11/52* (2013.01); *H01G 4/12* (2013.01);
(Continued)

(58) Field of Classification Search
CPC combination set(s) only.
See application file for complete search history.

(56) References Cited

U.S. PATENT DOCUMENTS 3,535,157 A * 10/1970 Roelants .................. B05D 1/28
427/428.06
5,313,802 A * 5/1994 Agrawal ............... F25J 3/04412
62/648
(Continued)

FOREIGN PATENT DOCUMENTS

CN    102506693 A    6/2012
JP    1-220888 A    9/1989
(Continued)

OTHER PUBLICATIONS

International Search Report, issued in PCT/JP2013/074551, dated Nov. 5, 2013.
(Continued)

*Primary Examiner* — Austin Murata
(74) *Attorney, Agent, or Firm* — Birch, Stewart, Kolasch & Birch, LLP

(57) ABSTRACT

The invention provides a process and an apparatus for producing a high quality electronic component by reducing sagging at pattern side walls, which may occur when patterns of a wiring, an electrode, etc. are printed by a screen printing process using an electroconductive paste, an insulation paste, or a semiconductor paste, and reducing a mesh mark on the patterns of a wiring, an electrode, etc., or a full solid surface film, as well as a pattern formation process, by which screen printing can be applied and double face printing can be conducted with the number of process steps less than a conventional process. A pattern is formed by that a pattern is printed on a blanket having a surface comprising polydimethylsiloxane using an electroconductive paste, an insulation paste, or a semiconductor paste by a screen
(Continued)

printing process, and the pattern is transferred from the blanket to a printing object.

7 Claims, 6 Drawing Sheets

(51) Int. Cl.
*H05K 3/20* (2006.01)
*C09D 11/037* (2014.01)
*C09D 11/52* (2014.01)
*H01G 4/12* (2006.01)
*H01L 31/0224* (2006.01)
*H05K 3/12* (2006.01)
*H01G 13/00* (2013.01)
*H01G 4/228* (2006.01)

(52) U.S. Cl.
CPC ............... *H01G 4/30* (2013.01); *H01G 13/00* (2013.01); *H01L 31/022425* (2013.01); *H05K 3/207* (2013.01); *H01G 4/228* (2013.01); *H01G 13/006* (2013.01); *H05K 3/1216* (2013.01); *H05K 3/1275* (2013.01); *H05K 2203/0143* (2013.01); *H05K 2203/0537* (2013.01); *Y02E 10/50* (2013.01)

(56) References Cited

U.S. PATENT DOCUMENTS

| | | |
|---|---|---|
| 6,651,557 B1 | 11/2003 | Costin et al. |
| 2008/0116558 A1* | 5/2008 | Kang ..................... H01G 4/06 257/686 |
| 2009/0199960 A1* | 8/2009 | Nuzzo .................... B82Y 10/00 156/230 |
| 2011/0070146 A1 | 3/2011 | Song et al. |
| 2012/0017433 A1* | 1/2012 | Chung .................... G06F 3/044 29/829 |
| 2012/0297996 A1 | 11/2012 | Kim et al. |
| 2014/0186525 A1* | 7/2014 | Seong .................. H05K 3/1275 427/123 |

FOREIGN PATENT DOCUMENTS

| | | |
|---|---|---|
| JP | 6-55827 A | 3/1994 |
| JP | 9-288911 A | 11/1997 |
| JP | 11-219845 A | 8/1999 |
| JP | 2000-276944 A | 10/2000 |
| JP | 2001-518409 A | 10/2001 |
| JP | 2006-281490 A | 10/2006 |
| JP | 2009-140790 A | 6/2009 |
| JP | 2010-58330 A | 3/2010 |
| JP | 2010-250196 A | 11/2010 |
| JP | 2011-63506 A | 3/2011 |
| JP | 2012-071506 A | 4/2012 |
| WO | WO 2011/025228 A2 | 3/2011 |
| WO | WO 2012/121534 A2 | 9/2012 |

OTHER PUBLICATIONS

Japanese Office Action dated May 17, 2016 for Japanese Application No. 2014-538365.
Extended European Search Report for European Application No. 13840499.1, dated Jun. 21, 2016.
Chinese Office Action and Search Report, dated Nov. 28, 2016, for Chinese Application No. 201380049763.9.

* cited by examiner

METHOD FOR FORMING PATTERN

TECHNICAL FIELD

The present invention relates to a formation process of a pattern, such as a wiring or electrode pattern.

BACKGROUND ART

As a technique for forming a wiring or an electrode, there is a technique, by which an electroconductive paste or an insulation paste is printed by a screen printing process. For example, for producing a wiring or an electrode of a solar cell, a frame electrode of a touch panel, an electrode of a laminated ceramic capacitor, a multilayer printed wiring board, or the like, printing is performed by printing an electroconductive paste or an insulation paste on to an object by a screen printing process. Further, for a semiconductor electrode, a semiconductor gas sensor, etc., an oxide semiconductor layer is formed on a substrate surface by screen printing using an oxide semiconductor paste.

With respect to a screen mask to be used by the above processes, an emulsion is painted on a zone, where no printing is necessary, and an electroconductive paste or an insulation paste does not pass through the zone painted with an emulsion. In other words, a pattern corresponding to a part, where mesh pores are open, can be depicted on an object.

Alternative to the process of printing by a screen printing process, another process has been known (Patent Documents 1 and 2), by which a transfer sheet provided with an electrode for transfer is prepared in advance by painting an electroconductive metal paste on a flexible sheet to a predetermined coat thickness, followed by drying, and then an electrode is formed by transferring the electrode pattern of the electroconductive metal paste from the transfer sheet to a ceramic electronic component. However, it is required to recover viscosity of the electrode surface by some method, such as heating, or spraying of a solvent for the electroconductive paste over the electrode to a semidry condition, when the electrode made of the electroconductive metal paste on the transfer sheet is pressed for transfer.

Meanwhile, Patent Document 3 describes with respect to a process for producing a toner carrier to be used in a copying machine, a printer, etc., that an electrode pattern with joint accuracy better than that by a conventional screen printing process can be formed by transferring a printing paste to an offset drum through the intermediary of a screen printing mask, and transferring and forming a wiring pattern composed of the transferred printing paste on to a circumference surface of an insulation layer provided on a cylindrical substrate surface.

Further, when printing is performed on both sides of a printing object, usually a technique is applied, by which i) a pattern is firstly printed on a surface of the printing object, and then ii) the printing object is turned over to reverse the back side and the front side, and a pattern is printed on the other surface where no pattern has been printed. However, for example, Patent Document 4 discloses a printing unit, which can print both the front side and the back side at once, for example, by conveying a printing object with rolls.

RELATED ART DOCUMENTS

Patent Documents

Patent Document 1: Japanese Unexamined Patent Application Publication No. 2000-276944

Patent Document 2: Japanese Unexamined Patent Application Publication No. H11-219845
Patent Document 3: Japanese Unexamined Patent Application Publication No. 2010-250196
Patent Document 4: Japanese National Publication of International Patent Application No. 2001-518409

SUMMARY OF THE INVENTION

Problems to be Solved by the Invention

As a technique for forming a wiring, an electrode, etc., as described above, there is a technique of printing by a screen printing process using an electroconductive paste, an insulation paste, a semiconductor paste, or the like, however, the process of forming a pattern of a wiring, an electrode, etc. by a screen printing process has a drawback in that sagging can take place at a side wall of the pattern in the course of drying of the paste to increase the line width. For example, if such sagging occurs during formation of a wiring and an electrode to be used for a solar cell, it causes decrease in the aperture ratio. Further, if such sagging occurs during formation of a frame electrode for a touch panel, it develops such a drawback that the area of a manual input zone is inevitably shrunk.

Additionally, ruggedness (a mesh mark) attributable to mesh unavoidably remains on a surface of a printed pattern of a wiring, an electrode, etc. When, for example, a stacked capacitor is produced with the electrode, it develops a drawback that the electrode may be broken to cause disconnection, or the electrodes intercalating a dielectric substance may short-circuit due to the ruggedness during hot pressing. Further, when a printed pattern of a wiring and electrode is used as an antenna, the roughness of the pattern surface leads to shortening of communication range, which may constitute a cause for deterioration of transmitting and receiving characteristics.

Meanwhile, a method using a transfer sheet, and a method using an offset drum instead of a screen printing process are disclosed in the Patent Documents 1 to 3, however drawbacks of sagging at a side wall or a residual mesh mark, nor a solving method thereof is mentioned by none of them.

Further, since, as described above, there has been a drawback that procedures including a step of printing one surface of a printing object, and a step of reversing the printing object, and thereafter a step of printing the other surface are required, and therefore the number of steps is large and the takt time increases. In contrast thereto, there is also a technique disclosed in Patent Document 4, which requires however a conveyance mechanism, and has weakness of a larger size of an apparatus, and therefore has not been able to be applied to a screen printing process.

The present invention was made in view of the above circumstances with a purpose to provide a process and an apparatus for producing a high quality electronic component by reducing sagging at pattern side walls, which may occur when patterns of a wiring, an electrode, etc. are printed by a screen printing process using an electroconductive paste, an insulation paste, or a semiconductor paste, and reducing a mesh mark on the patterns of a wiring, an electrode, etc., or a full solid surface film, and to provide a pattern formation process, in which screen printing can be applied and double face printing can be conducted with the number of process steps less than a conventional process.

Means for Solving the Problems

The inventors studied diligently to attain the purposes to acquire a knowledge that the purposes can be attained by using a blanket, which has a high surface smoothness, and has affinity with a paste lower than the affinity between a printing object and a paste, and by printing a pattern on the blanket by a screen printing process, and transferring the pattern to the printing object.

The present invention was completed based on the knowledge, and the present invention provides the following inventions:

[1] A formation process of a pattern characterized in that a pattern is printed on a blanket having a surface comprising polydimethylsiloxane using an electroconductive paste, an insulation paste, or a semiconductor paste by a screen printing process, and the pattern is transferred from the blanket to a printing object.

[2] The formation process of a pattern according to [1] above, wherein the blanket is sheet-formed.

[3] The formation process of a pattern according to [1] above, wherein the blanket is roll-formed.

[4] The formation process of a pattern according to [1] above, wherein an electrode pattern is formed using an electroconductive paste.

[5] The formation process of a pattern according to [4] above, wherein the electrode pattern is a wiring electrode to be used in a touch panel, a solar cell, a laminated ceramic capacitor, an antenna, and a multilayer printed wiring board.

[6] The formation process of a pattern according to [1] above, wherein a first pattern is printed on the blanket by a screen printing process using an electroconductive paste, an insulation paste, or a semiconductor paste, then the printing object is placed on the blanket, on which the first pattern has been printed, a second pattern is additionally printed on an surface of the printing object opposite to a surface facing to the blanket, and then the printing object is released from the blanket so as to transfer the first pattern to the printing object.

[7] The formation process of a pattern according to [6] above, wherein the second pattern is printed by a screen printing process.

[8] The formation process of a pattern according to [6] above, wherein the first pattern and the second pattern are wiring electrodes to be used in a touch panel, a solar cell, a laminated ceramic capacitor, an antenna, and a multilayer printed wiring board.

[9] The formation process of a pattern according to [6] above, wherein the process is used for producing a capacitance type device.

[10] An apparatus for forming a pattern comprising a screen printing mechanism and a blanket, on which a pattern is to be printed by the screen printing mechanism, and transferring the pattern printed on the blanket to a printing object characterized in that the blanket has a surface comprising polydimethylsiloxane.

Effects of the Invention

According to the present invention, pattern sagging, which occurs during printing by a screen printing process, can be reduced, and a pattern side wall can be formed to have a sharp contour. As the result, thinning of a pattern can be achieved, and the surface roughness of a pattern can be also reduced. In principle, the present invention can be applied not only to a thin line pattern, but also to any pattern having a dimension beyond several μm. Further, since a step for reversing a printing object is not required according to the present invention, patterns can be formed on both sides of a printing object with a smaller number of process steps than in a conventional process, and printing on both sides of a printing object can be performed without using a roll mask or a conveyance mechanism.

MODE FOR CARRYING OUT THE INVENTION

A formation process of a pattern is characterized in that a pattern is printed on a blanket having a smooth surface comprising polydimethylsiloxane (PDMS) using an electroconductive paste, an insulation paste, or a semiconductor paste by a screen printing process, and the pattern is transferred to a printing object (object).

Specifically, for example, when an electrode pattern of a ceramic capacitor is formed by a process according to the present invention, an electrode pattern is formed on a blanket having a smooth and tacky surface using an electroconductive paste by a screen printing process, and then the blanket is pressed to a ceramic green sheet by means of a squeegee, a roll or the like to transfer the electroconductive paste to the ceramic green sheet.

Examples of a blanket having a smooth surface include a blanket made of polydimethylsiloxane (PDMS), and a blanket having a layer made of polydimethylsiloxane (PDMS) on the top surface.

Examples of an object on which an electrode is formed according to the present invention include various heretofore known materials such as various glasses, a metal like stainless steel, paper, and a film of a resin material like polyimide (PI) in addition to the ceramic green sheet.

According to the present invention the blanket and an object on which an electrode is to be formed may be wound up to a roll form or in a sheet form.

As a paste to be used in a process according to the present invention, those used ordinarily for forming an electrode, a wiring, etc. in a screen printing process can be used as they are, and examples of an electroconductive paste and an insulation paste include a binder resin containing therein respectively a metal powder, such as Au, Ag, Cu, and Al, or an inorganic insulation powder. Further, examples of a semiconductor paste include a solvent with a fine powder of a metallic oxide dispersed therein.

The thickness of a pattern to be formed on an object by a process according to the present invention varies depending on an intended pattern, such as an electrode, an insulation layer, and a semiconductor layer, and although there is no particular restriction thereon, it is ordinarily approx. between 100 nm and 100 μm.

A process according to the present invention can be applied to production of any and all electrical or electronic components using a wiring or an electrode, such as a wiring and an electrode of a solar cell, a frame electrode of a touch panel, an electrode of a laminated ceramic capacitor, an antenna, and a multilayer printed wiring board.

Next, a formation process of a pattern for double side printing according to the present invention is characterized in that a first pattern is printed on the blanket by a screen printing process using an electroconductive paste, an insulation paste, or a semiconductor paste, then the printing object is placed on the blanket, on which the first pattern has been printed, a second pattern is additionally printed on an surface of the printing object opposite to a surface facing to the blanket, and then the printing object is released from the blanket so as to transfer the first pattern to the printing object.

Figure 7:
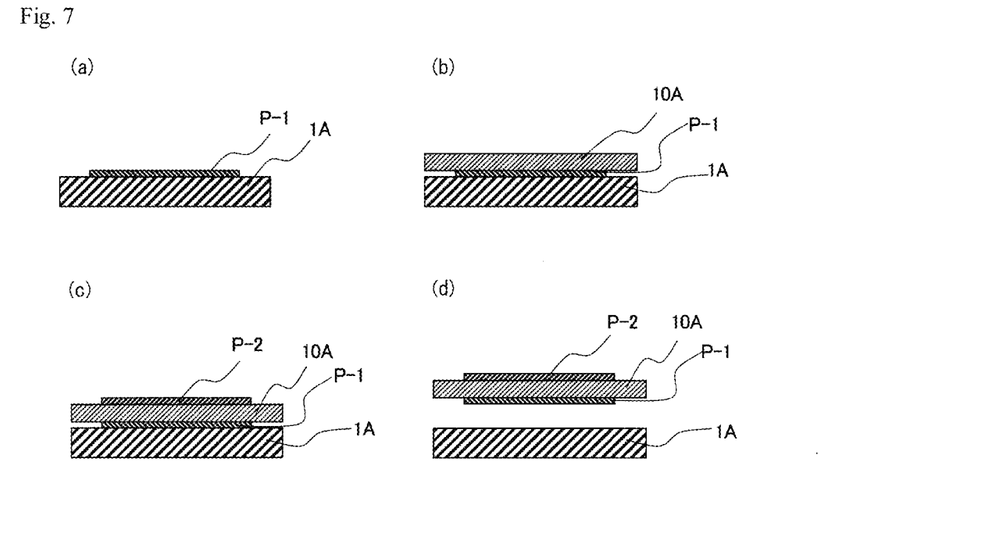
FIG. 7 is an explanatory diagram of an example of a formation process of a pattern according to the present invention.

FIG. 7 shows an explanatory diagram of an example of a formation process of a pattern according to the present invention. As depicted, according to the present invention, the first pattern (back side pattern) P-1 is firstly printed on a blanket 1A having a flat surface made of PDMS (Fig. (a)). Then a printing object 10A is placed on the blanket 1A, on which the first pattern P-1 has been printed (Fig. (b)). Since the thickness of the pattern is very small, the printing object 10A is placed to substantially contact the blanket 1A made of PDMS. Next, the second pattern (front side pattern) P-2 is directly printed on a surface of the printing object 10A opposite to the surface facing to the blanket 1A (Fig. (c)). Thereafter, the printing object 10A is released from the blanket 1A allowing an ink of the first pattern P-1 printed on the blanket 1A to transfer to the printing object 10A (Fig. (d)). Through the process series, a printing object 10A, on both the surfaces of which the intended first and second patterns P-1 and P-2 are printed respectively, can be obtained.

In the double side printing process according to the present invention, as a printing process for the first pattern P-1 a screen printing process is applied. As a printing process for the second pattern P-2, a technique, such as screen printing, flexography, gravure print, and inkjet printing, can be used, and favorably screen printing and gravure printing processes, especially a screen printing process is used.

In the double side printing process according to the present invention, a paste, a blanket and a printing object to be used for printing a pattern, may be similar to those described above. Further, with respect to the thickness of a pattern to be formed may be at the same level as described above. Further, according to the present invention, in order to improve the transferability of the first pattern P-1 printed on a blanket 1A to a printing object 10A, the surface of a printing object 10A contacting a blanket 1A may be provided with an adhesive layer.

The double side printing process according to the present invention can be applied to production of any and all electrical or electronic components using a wiring or an electrode as described above, and also favorably to production of a capacitance type device, for example, a capacitance type piezoelectric device.

An apparatus for forming a pattern according to the present invention includes a screen printing mechanism and a blanket, on which a pattern is to be printed by the screen printing mechanism, transfers the pattern printed on the blanket to a printing object, and is characterized in that the blanket has a surface made of PDMS. The apparatus according to the present invention can be applied favorably to the process according to the present invention.

With respect to a blanket and a printing object for an apparatus according to the present invention, those described above may be used. A screen printing mechanism in an apparatus according to the present invention includes, for example, a screen mask, a squeegee and the like as described below, and is constituted similarly as an ordinary screen printing machine. The mechanism may be selected according to an intended pattern to be formed, and there is no particular restriction thereon.

An explanatory diagram of an example of an apparatus for forming a pattern according to the present invention is shown in each of FIGS. 8 to 11, provided that the apparatus for forming a pattern according to the present invention is not limited to the examples, and include various embodiments to which various modification have been added appropriately. For simplification, an emulsion pattern was omitted in each Figure.

Figure 8:
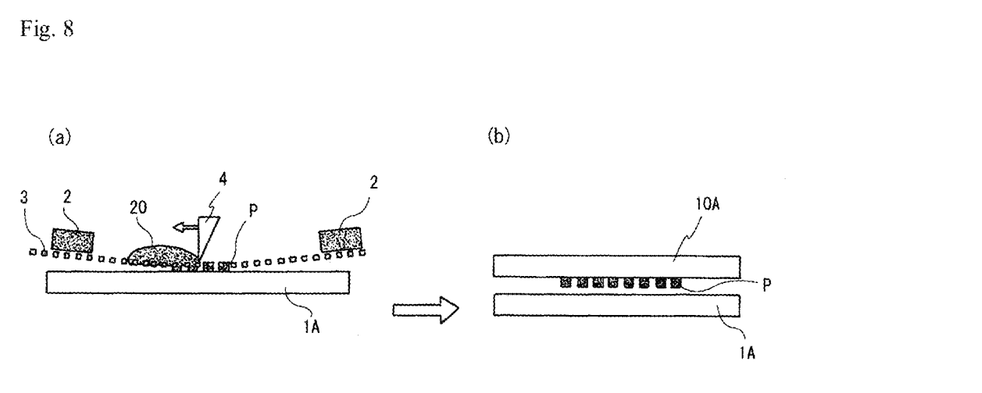
FIG. 8 is an explanatory diagram of an example of an apparatus for forming a pattern according to the present invention.

The apparatus shown in FIG. 8 is for printing a sheet-formed printing object 10A using a sheet-formed blanket 1A. Specifically, firstly at a screen printing unit (a), a pattern P is printed on a sheet-formed blanket 1A using a paste 20 by a screen mask 3 fixed on a frame 2. The symbol 4 in the figure stands for a squeegee. Next, the blanket 1A printed with the pattern P is conveyed to a transferring unit (b), where the pattern P on the blanket 1A is transferred to a sheet-formed printing object 10A to obtain a printing object 10A on which an intended pattern P is printed.

Figure 9:
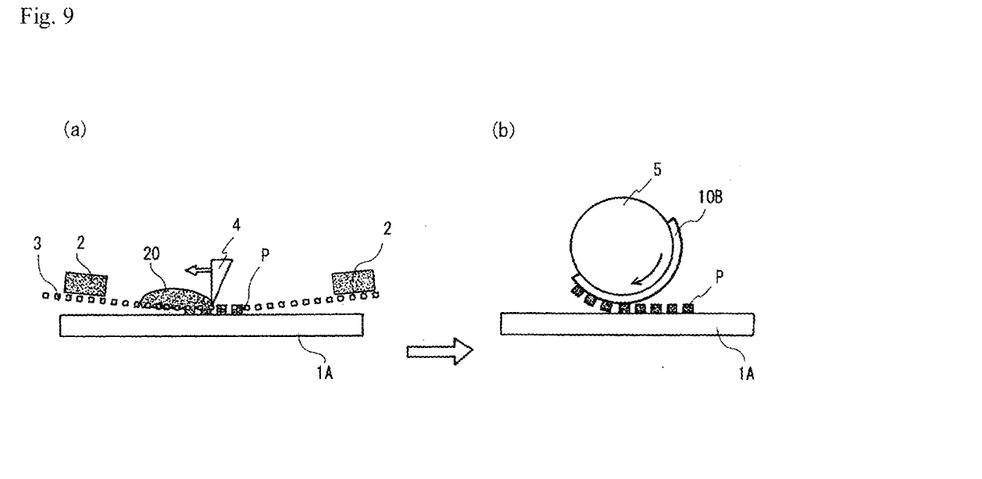
FIG. 9 is an explanatory diagram of another example of an apparatus for forming a pattern according to the present invention.

The apparatus shown in FIG. 9 is for printing a roll-formed printing object 10B using a sheet-formed blanket 1A. Specifically, firstly at a screen printing unit (a), a pattern P is printed on a sheet-formed blanket 1A using a paste 20 by a screen mask 3 fixed on a frame 2. Next, the blanket 1A printed with the pattern P is conveyed to a transferring unit (b), where the pattern P on the blanket 1A is transferred to a roll-formed printing object 10B carried on the outer circumference of an impression cylinder 5 to obtain a printing object 10B on which an intended pattern P is printed.

Figure 10:
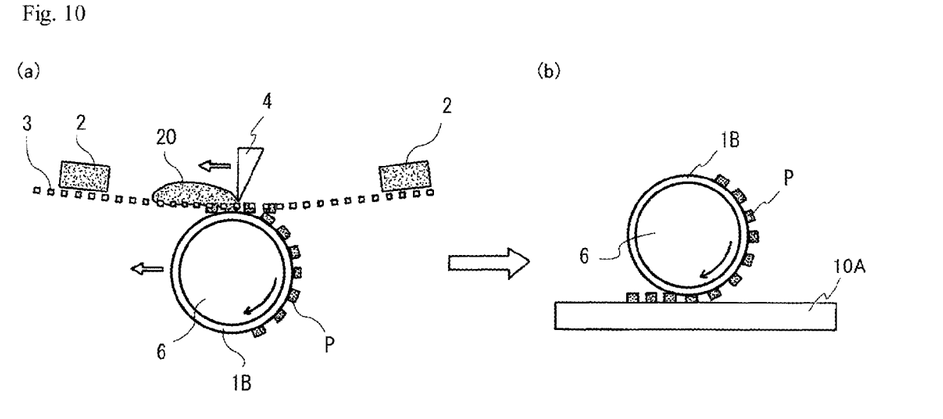
FIG. 10 is an explanatory diagram of further another example of an apparatus for forming a pattern according to the present invention.

The apparatus shown in FIG. 10 is for printing a sheet-formed printing object 10A using a roll-formed blanket 1B. Specifically, firstly at a screen printing unit (a), a pattern P is printed on a roll-formed blanket 1B carried on the outer circumference of a blanket cylinder 6 using a paste 20 by a screen mask 3 fixed on a frame 2. In this case, a blanket cylinder 6 is rotated, while a squeegee 4 and the blanket cylinder 6 are moved respectively in the directions of the arrows indicated in the Figure. Next, the blanket 1B printed with the pattern P, or a sheet-formed printing object 10A is conveyed to a transferring unit (b), where the pattern P on the blanket 1B is transferred to a sheet-formed printing object 10A to obtain a printing object 10A on which an intended pattern P is printed.

Figure 11:
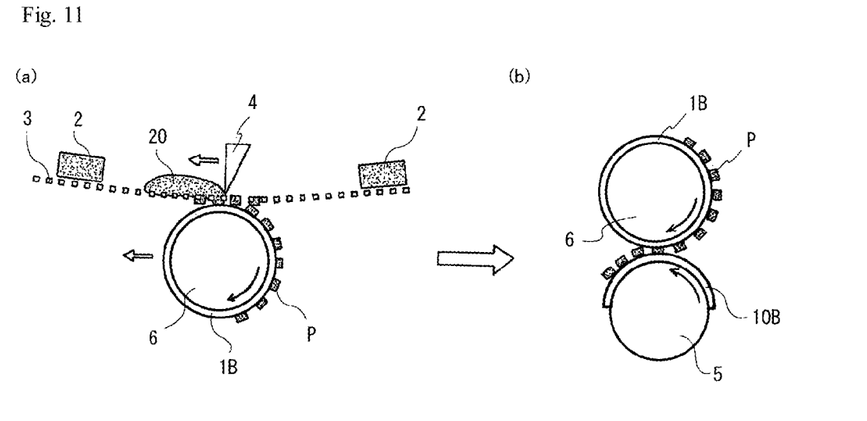
FIG. 11 is an explanatory diagram of further another example of an apparatus for forming a pattern according to the present invention.

The apparatus shown in FIG. 11 is for printing a roll-formed printing object 10B using a roll-formed blanket 1B. Specifically, firstly at a screen printing unit (a), a pattern P is printed on a roll-formed blanket 1B carried on the outer circumference of a blanket cylinder 6 using a paste 20 by a screen mask 3 fixed on a frame 2. Also in this case, a blanket cylinder 6 is rotated, while a squeegee 4 and the blanket cylinder 6 are moved respectively in the directions of the arrows indicated in the Figure. Next, the blanket 1B printed with the pattern P, or a roll-formed printing object 10B is conveyed to a transferring unit (b), where the pattern P on the blanket 1B is transferred to a roll-formed printing object 10B to obtain a printing object 10B on which an intended pattern P is printed.

EXAMPLES

The present invention will be described below by way of Examples and Comparative Example, provided that the present invention be not limited to the experimental examples.

Example 1

In the following Examples and Comparative Example, as an electroconductive paste, a commercially-supplied paste for screen printing containing silver fine particles (HIMEC Type x7109, made by Namics Corporation) was used. Further, a screen mask having a 300 μm-wide linear mesh openings (emulsion thickness: 13.8 μm, mesh count per inch: 325, wire diameter: 28 μm, mesh thickness: 48 μm) was used.

Firstly, as Comparative Example 1, a pattern was printed by a screen printing process on a approx. 15×15 cm² ceramic green sheet with an electroconductive paste. The thickness of a paste film was approx. 15 μm.

Figure 1:
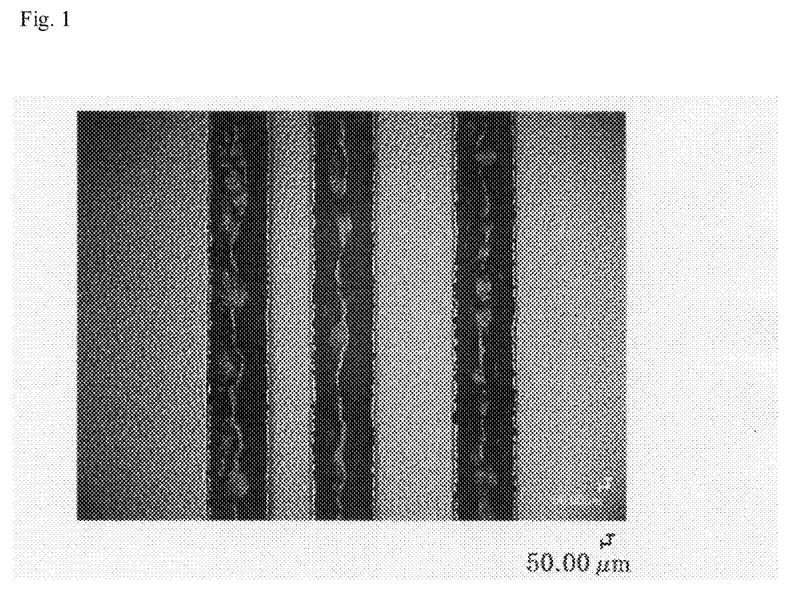
FIG. 1 is an image from an optical stereoscopic microscope of an electrode pattern immediately after printing with an electroconductive paste on a ceramic green sheet by a screen printing process.

FIG. 1 is an image from an optical stereoscopic microscope of the pattern immediately after printing. A mesh mark is recognizable on a surface of the pattern, and also undulations caused by sagging are recognizable at side walls.

Figure 2:
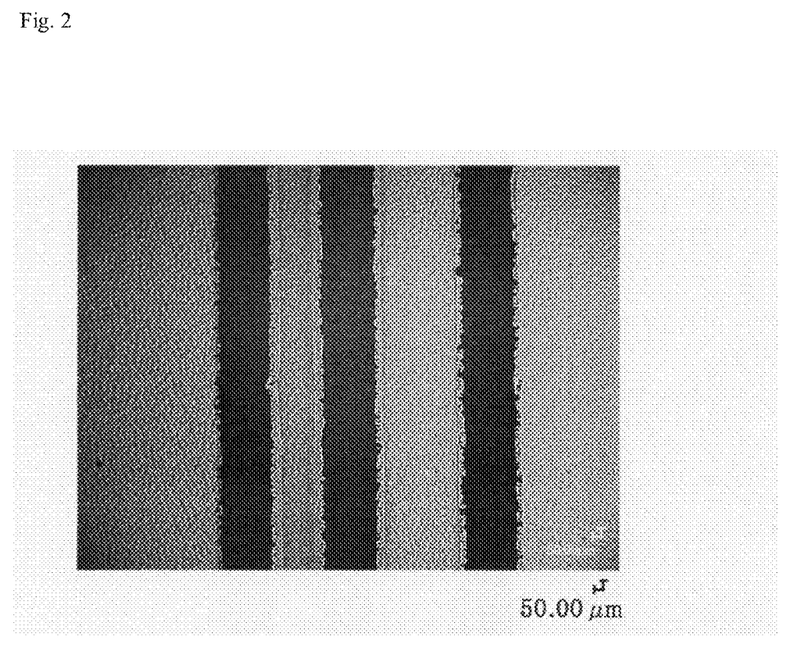
FIG. 2 is an image from an optical stereoscopic microscope of an electroconductive paste printed on a ceramic green sheet by a screen printing process and dried thoroughly in the air.

FIG. 2 is an image from an optical stereoscopic microscope of an electroconductive paste pattern shown in FIG. 1 after drying thoroughly in the air. It can be recognized that the mesh mark has almost disappeared because the surface is smoothed in the course of drying of the paste, however the undulations at side walls become worse due to the smoothing.

Next, using a blanket with a polydimethylsiloxane (PDMS) film on the outermost surface, a pattern of the paste was printed on the blanket by a screen printing process, and then the pattern was transferred from the PDMS film on to a ceramic green sheet to obtain a pattern of Example 1.

Figure 3:
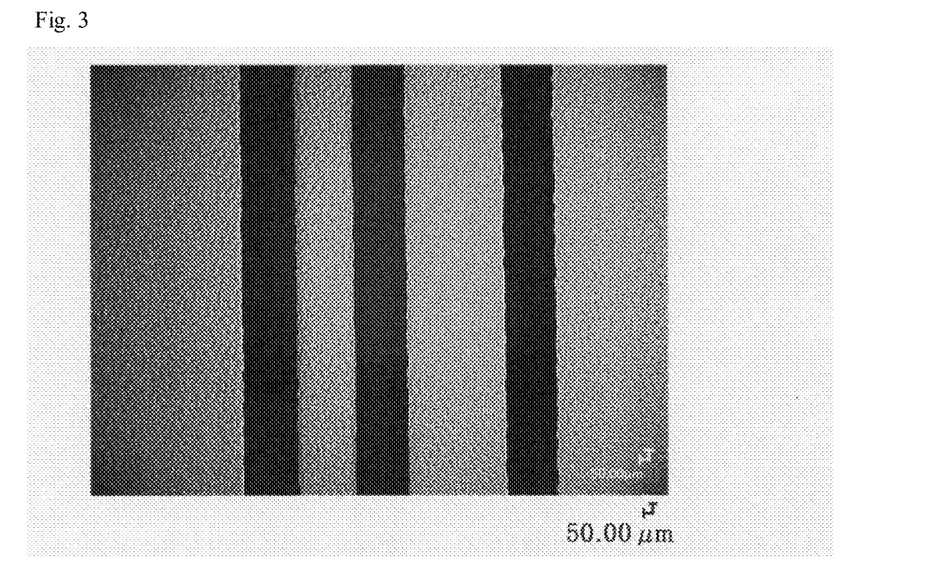
FIG. 3 is an image from an optical stereoscopic microscope of an electrode pattern immediately after a process of printing an electrode pattern on a polydimethylsiloxane (PDMS) film with an electroconductive paste by a screen printing process, and transferring the electrode pattern on to a ceramic green sheet.

FIG. 3 is an image from an optical stereoscopic microscope of the paste pattern immediately after transfer from the PDMS film on to a ceramic green sheet. There is no recognizable mesh mark as seen in FIG. 1, and the surface is smooth reflecting the flatness of the PDMS film. Further, the undulations at side walls due to sagging are mitigated.

Figure 4:
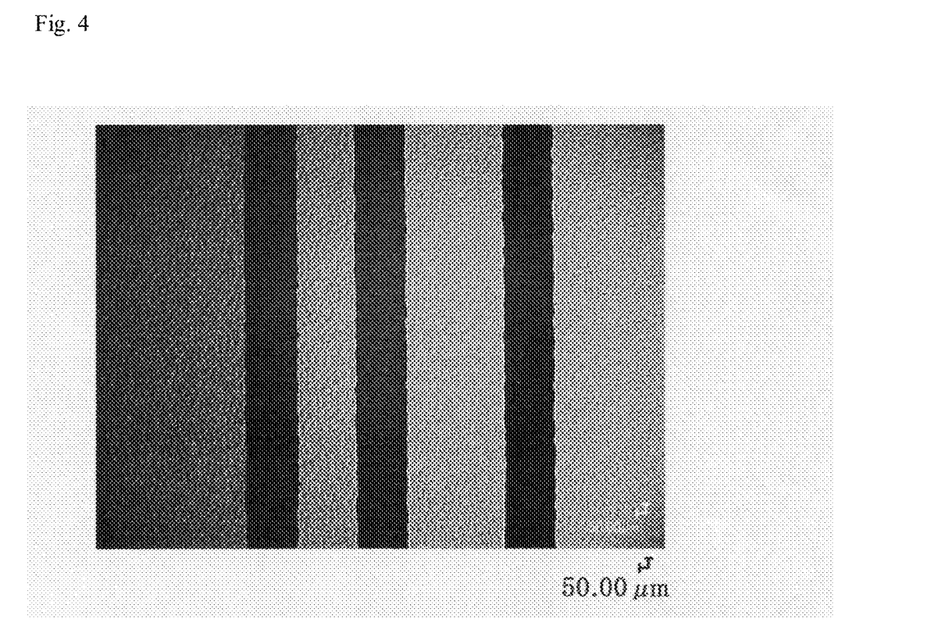
FIG. 4 is an image from an optical stereoscopic microscope of an electrode pattern after a process of printing an electrode pattern on a polydimethylsiloxane (PDMS) film with an electroconductive paste by a screen printing process, transferring the electrode pattern on to a ceramic green sheet, and drying the same thoroughly in the air.

FIG. 4 is an image from an optical stereoscopic microscope of the paste shown in FIG. 3 after drying thoroughly in the air. Also, there is no recognizable sagging as seen in FIG. 1 and FIG. 2, and it can be known that the pattern shape immediately after printing shown in FIG. 3 is maintained.

Figure 5:
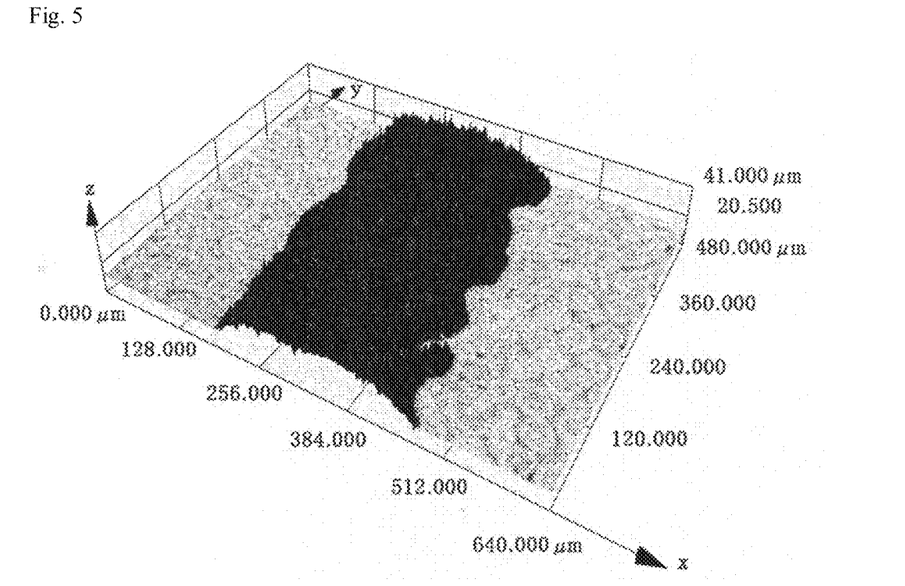
FIG. 5 is a 3-dimensional image of a pattern obtained by observation with a confocal laser microscope of the electrode pattern on which FIG. 2 was photographed.

FIG. 5 is a 3-dimensional image of a pattern obtained by observation with a confocal laser microscope of the pattern on which FIG. 2 was photographed. When printed directly on a ceramic green sheet, the side wall shoulder of the pattern is rounded under the influence of sagging.

Figure 6:
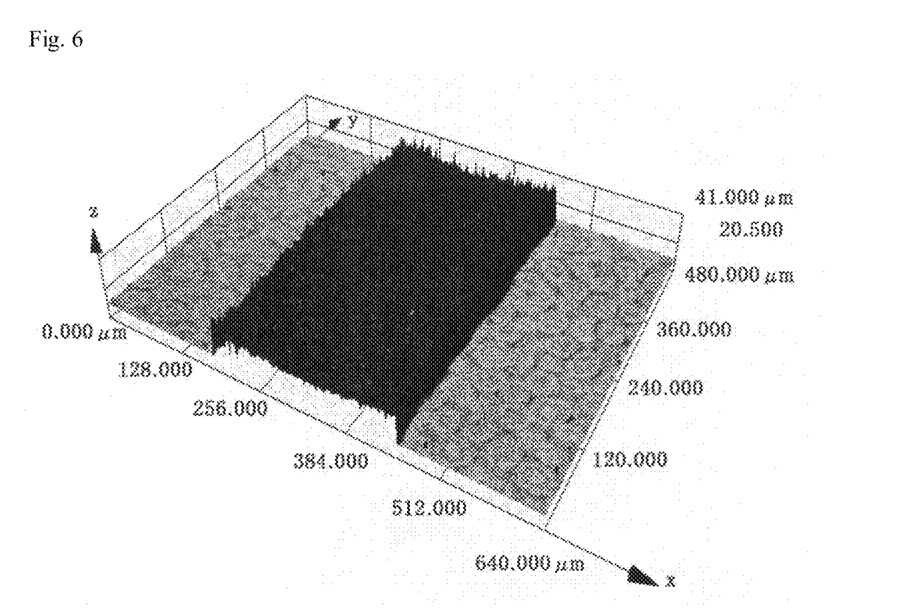
FIG. 6 is a 3-dimensional image of a pattern obtained by observation with a confocal laser microscope of the electrode pattern on which FIG. 4 was photographed.

Meanwhile, FIG. 6 is a 3-dimensional image of a pattern obtained by observation with a confocal laser microscope of the pattern on which FIG. 4 was photographed. When transferred from a blanket, it is clear that the shape of the pattern side wall is very sharp.

Although not illustrated, it has been able to confirm that even a 3 cm-square solid pattern can be transfer from a blanket on to an object to be printed.

Example 2

In the following Example, as a printing paste an Ag paste for a solar cell (HIMEC Type x7109, made by Namics Corporation) was used. Further, as a printing object 10A, a polyethylene terephthalate film 12 having an adhesive layer 11 on one side (SuRemLiner SRL-0753B(AS), made by Lintec Corporation). As a screen mask, a mask with a pattern containing a 9 mm-square quadrate pattern and a lead line originated from the quadrate pattern was used.

Figure 12:
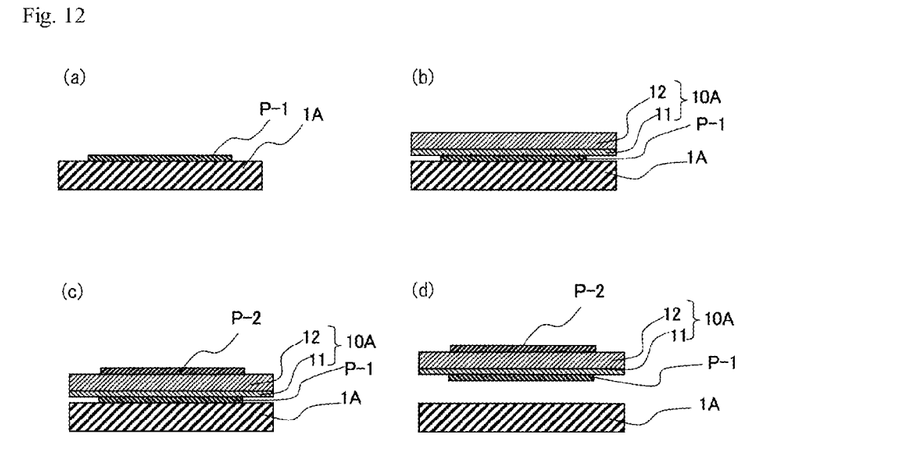
FIG. 12 is an explanatory diagram of a formation process of a pattern printed on both sides according to Example 2.

A double side printing pattern of Example 2 was formed according to the procedures shown in FIG. 12.

As shown in FIG. 12(a), using a blanket 1A having a polydimethylsiloxane (PDMS) film on the outermost surface, firstly the first paste pattern P-1 was printed thereon by a screen printing process. Next, as shown in FIG. 12(b), a printing object 10A was placed on the blanket 1A printed with the first pattern P-1, such that the adhesive layer 11 is positioned on the side contacting the blanket 1A. Next, as shown in FIG. 12(c), the second paste pattern P-2 was printed on a surface of the printing object 10A opposite to the surface facing to the blanket 1A. In this case, the pattern P-1 and the pattern P-2 were identical. Then, as shown in FIG. 12(d), the printing object 10A was released from the blanket 1A to transfer the first pattern P-1 to the printing object 10A, to obtain a printing object 10A of Example 2, on both sides of which paste patterns were formed.

Figure 13:
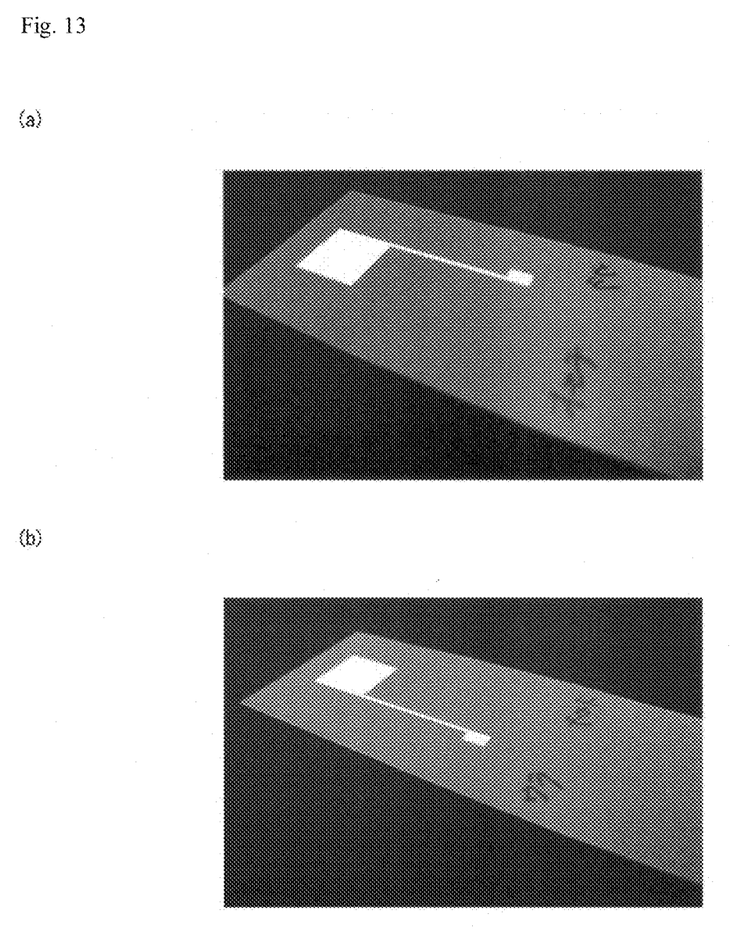
FIG. 13 are photographs of a printing object obtained in Example 2, (a) taken from a side with an adhesive layer, and (b) taken from a side without an adhesive layer.

FIG. 13 is photographs of an obtained printing object, wherein (a) is a photograph taken from the side with an adhesive layer (marked as "Front side" in the photo (in Japanese)), and (b) is a photograph taken from the side without an adhesive layer (marked as "Back side" in the photo (in Japanese)). As the result, a sheet printed on both sides was obtained without requiring a step for turning a layered sheet over, so that the takt time can be reduced. Further, as obvious from FIGS. 13(a) and (b), the first and the second patterns, both with accuracy sufficient for practical use, could be formed at a mutually superimposing position on the obtained sheet printed on both sides.

DESCRIPTION OF SYMBOLS 1A, 1B Blanket
2 Frame
3 Screen Mask
4 Squeegee
5 Impression Cylinder
6 Blanket Cylinder
10A, 10B Printing Object
11 Adhesive Layer
12 Polyethylene Terephthalate Film
20 Paste
P, P-1, P-2 Pattern

The invention claimed is:

1. A formation process of a pattern characterized in that a first pattern is printed on a blanket having a surface comprising polydimethylsiloxane using an electroconductive paste, an insulation paste, or a semiconductor paste by a screen printing process, then a printing object is placed on the blanket, on which the first pattern has been printed, a second pattern is additionally printed by a screen printing process on a surface of the printing object opposite to a surface facing to the blanket, and then the printing object is released from the blanket so as to transfer the first pattern to the printing object.

2. The formation process of a pattern according to claim 1, wherein the blanket is sheet-formed.

3. The formation process of a pattern according to claim 1, wherein the blanket is roll-formed.

4. The formation process of a pattern according to claim 1, wherein an electrode pattern is formed using the electroconductive paste.

5. The formation process of a pattern according to claim 4, wherein the electrode pattern is a wiring electrode suitable for use in a touch panel, a solar cell, a laminated ceramic capacitor, an antenna, and a multilayer printed wiring board.

6. The formation process of a pattern according to claim 1, wherein the first pattern and the second pattern are wiring electrodes suitable for use in a touch panel, a solar cell, a laminated ceramic capacitor, an antenna, and a multilayer printed wiring board.

7. The formation process of a pattern according to claim 1, wherein the process is used for producing a capacitance type device.

* * * * *